(12) United States Patent
Koskinen

(10) Patent No.: US 9,876,515 B2
(45) Date of Patent: Jan. 23, 2018

(54) ADAPTIVE TRANSMITTER EFFICIENCY OPTIMIZATION

(71) Applicant: Nokia Corporation, Espoo (FI)

(72) Inventor: Matti Tapani Koskinen, Perniö (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/297,285

(22) Filed: Jun. 5, 2014

(65) Prior Publication Data
US 2015/0358038 A1   Dec. 10, 2015

(51) Int. Cl.
H04L 25/03  (2006.01)
H04B 1/04  (2006.01)

(52) U.S. Cl.
CPC ..... H04B 1/0475 (2013.01); *H04B 2001/045* (2013.01)

(58) Field of Classification Search
CPC ........ H03F 1/3241; H03F 1/34; H03F 1/3211; H03F 1/3217; H04B 1/10
USPC ......... 375/296, 297, 346; 370/311; 330/149, 330/127, 279; 323/282; 714/700
See application file for complete search history.

(56) References Cited

U.S. PATENT DOCUMENTS

| | | | |
|---|---|---|---|
| 5,115,514 A | 5/1992 | Leslie | |
| 8,565,343 B1* | 10/2013 | Husted | H04B 1/0475 375/297 |
| 8,659,356 B2* | 2/2014 | Qian | H03F 1/0216 323/282 |
| 2002/0186783 A1* | 12/2002 | Opas | H03F 1/3294 375/297 |
| 2004/0237007 A1* | 11/2004 | Busking | H03C 3/406 714/700 |
| 2006/0158254 A1* | 7/2006 | Johnson | H03F 1/3247 330/149 |
| 2007/0270174 A1 | 11/2007 | Heinonen et al. | |
| 2008/0032634 A1* | 2/2008 | Magoon | H03F 1/34 455/75 |
| 2011/0064171 A1* | 3/2011 | Huang | H03F 1/3247 375/346 |
| 2011/0095826 A1* | 4/2011 | Hadjichristos | H03F 1/523 330/279 |
| 2012/0269240 A1* | 10/2012 | Balteanu | H03F 1/0227 375/219 |
| 2013/0027129 A1* | 1/2013 | Langer | H04B 1/0458 330/127 |
| 2013/0028348 A1* | 1/2013 | Rofougaran | H04B 1/001 375/296 |
| 2015/0124672 A1* | 5/2015 | Lindoff | H04B 1/04 370/311 |

* cited by examiner

*Primary Examiner* — Daniel Washburn
*Assistant Examiner* — Fitwi Hailegiorgis
(74) *Attorney, Agent, or Firm* — Mintz Levin Cohn Ferris Glovsky and Popeo, P.C.

(57) ABSTRACT

In one aspect there is provided a method. The method may include sampling an output of a power amplifier, wherein the sampled power amplifier output represents a modulated carrier being transmitted; processing to baseband the sampled power amplifier output; and determining one or more adjustments to the power amplifier, wherein the determined one or more power adjustments are determined based on at least one or more measurements performed on the baseband. Related apparatus, systems, methods, and articles are also described.

21 Claims, 10 Drawing Sheets

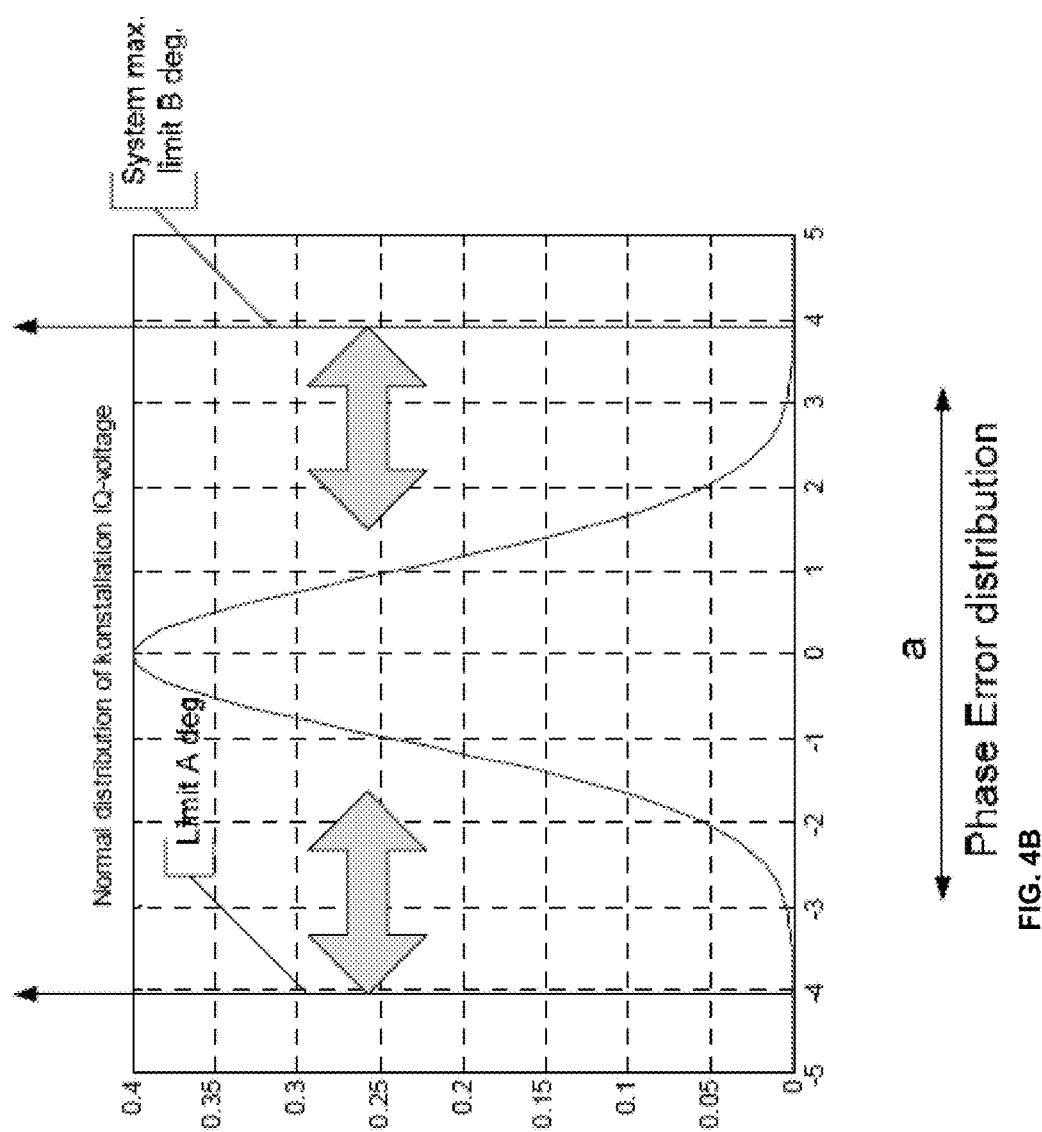

ADAPTIVE TRANSMITTER EFFICIENCY OPTIMIZATION

FIELD

The subject matter described herein relates to wireless communications.

BACKGROUND

Radios including user equipment may include a transmitter subsection which generates a carrier signal and modulates the carrier signal in order to allow the carrier signal transmitted via one or more antennas to carry information. Moreover, transmitter subsection may include a power amplifier to amplify the transmitted signal with sufficient power to enable reception by a distant receiver. If the power amplifier does not provide sufficient power, the radiated power from the transmitter will not be sufficient to close a link between the transmitter and receiver.

SUMMARY

Methods and apparatus, including computer program products, are provided for controlling a transmitter.

In some example embodiments, there may be provided a method. The method may include sampling an output of a power amplifier, wherein the sampled power amplifier output represents a modulated carrier being transmitted; processing to baseband the sampled power amplifier output; and determining one or more adjustments to the power amplifier, wherein the determined one or more power adjustments are determined based on at least one or more measurements performed on the baseband.

In some variations, one or more of the features disclosed herein including the following features can optionally be included in any feasible combination. The sampling may include sampling each of a plurality of transmit chains to determine one or more adjustments to a corresponding power amplifier at each of the plurality of transmit chains. The plurality of transmit chains may include multiple input, multiple output transmitters. The determining may further comprise measuring in-phase and quadrature phase values output by a decoder. At least one parameter representative of a quality of the baseband may be calculated. The method may further include comparing the at least one parameter representative of a quality of the baseband to one or more reference values to determine the one or more adjustments to the power amplifier. The one or more reference values may take into account a temperature. The quality may represent at least one of a phase error and/or an error vector magnitude. The determined one or more adjustments to the power amplifier may include an adjustment to at least one of the power amplifier, a transmit driver, and/or a radio frequency circuitry. The determining may further comprise determining the one or more adjustments to the power amplifier based on the one or more measurements performed on the baseband and a minimization of the power consumption of the power amplifier. The sampling may be performed by at least one of a dedicated receiver or a shared receiver.

DESCRIPTION OF DRAWINGS

In the drawings,

FIG. 4B depicts a plot of phase error distribution, in accordance with some exemplary embodiments;

Figure 1:
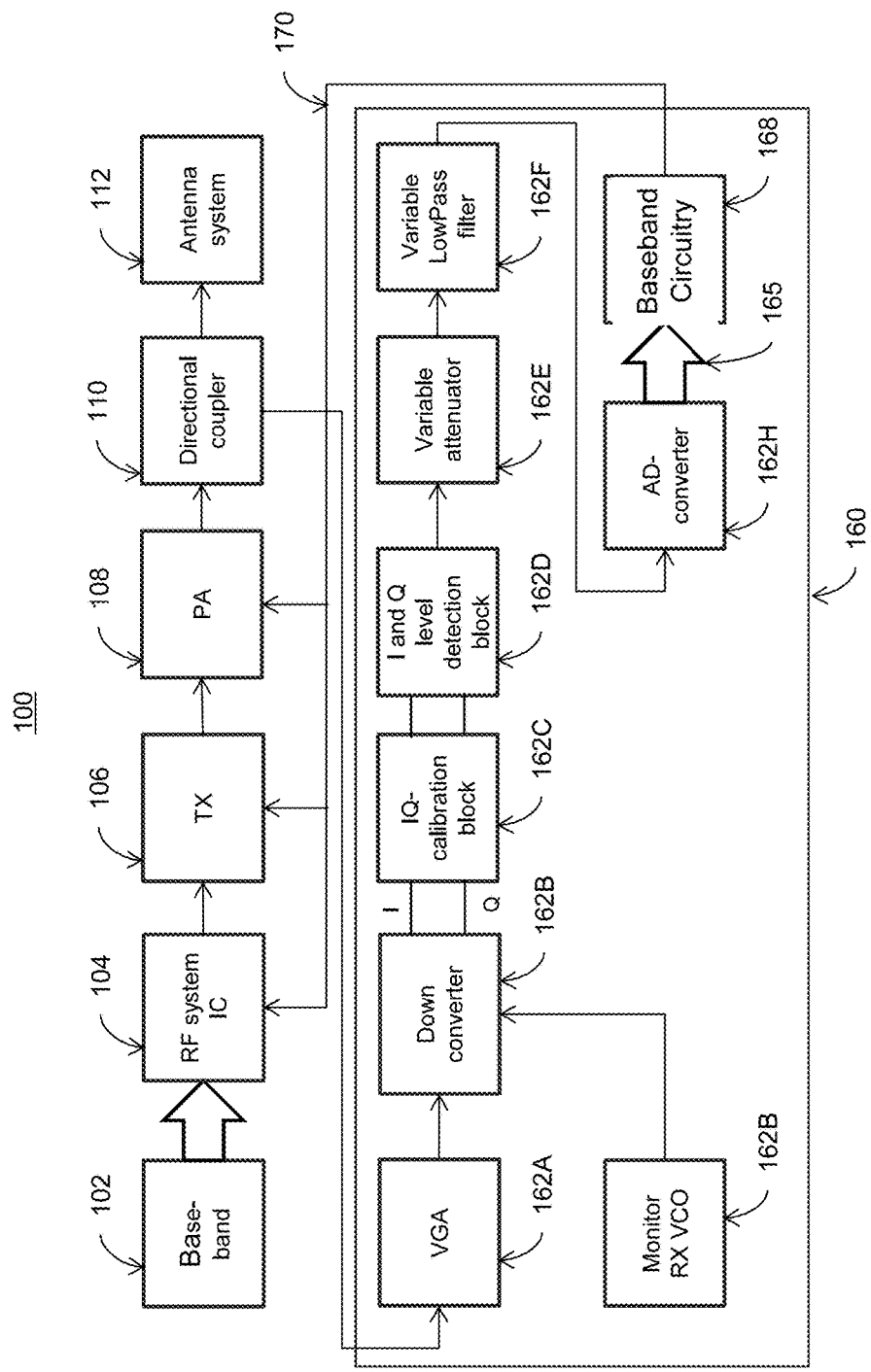
FIG. 1 depict an example of a transmitter, in accordance with some exemplary embodiments.

Like labels are used to refer to same or similar items in the drawings.

DETAILED DESCRIPTION

A major source of power consumption at a user equipment, such as a cell phone, a smartphone, a tablet, and other wireless devices, relates to transmitter power amplifiers. Some power amplifiers operate in a non-linear mode. For example, in some cellular access technologies, a power amplifier may operate at a maximum radio frequency (RF) power level of about 34 Decibel-milliwatts (dBm), and this amplifier may operate in a saturated state and have an efficiency of about between 30% to 50%. However, other cellular access technologies may implement a power amplifier in a linear region of operation but have a power level of about 24 to 28 dBm and a lower efficiency of about 15% to 30%.

In some example embodiments, there may be provided an adaptive adjustment of a power amplifier, and the adaptation is performed by sampling the transmit signal, converting the transmit signal to baseband, and then performing one or more measurements on the converted baseband, so that the measurements can be used to adapt the operation of the power amplifier and, in particular, the operating point of the power amplifier (which may impact the efficiency and quality of the power amplifier).

FIG. 1 depicts an example of a transmitter 100, in accordance with some example embodiments. The transmitter 100 may include a signal, such as baseband signal 102, that is provided as an input to radio frequency (RF) circuitry 104. The RF circuitry 104 may include various components, such as a mixer, an oscillator, digital signal processing circuitry, and the like, to form and output a modulated carrier signal. The modulated carrier signal is then provided as an input to a transmit driver 106. The transmit driver 106 may be used to control and/or adjust the level of the modulated carrier signal that is provided as an input to a power amplifier 108. For example, transmit driver 106 may include variable gain amplifiers and/or attenuators to vary the modulated carrier signal to an appropriate level at the input of the power amplifier 108.

Next, power amplifier 108 may amplify the modulated carrier signal received from transmit driver 106 in order to provide sufficient power for transmission via one or more antennas 112. The transmit driver 106 and/or power amplifier 106 may use look-up tables to determine a shape of the transmitted signal to for example comply with waveform requirements for the transmitted signal. For example, the look-up table may specify values of power amplifier supply voltage of the power amplifier, standing wave ratio, bias currents, power amplifier levels, and the like defining the operating characteristics of the power amplifier 108. These operating characteristics may thus define for example the amount of amplification, amplifier efficiency, and the like of the power amplifier (as well as the quality of the amplified output). Moreover, the look-up values may take into account temperature, and/or other factors that may affect link margin and total radiated power.

In some example embodiments, transmitter 100 may have sampling receiver circuitry 160 in order to sample the transmit signal output by power amplifier 108. For example, directional coupler 110 may sample the transmit signal by coupling a portion and providing the sampled portion to sampling receiver circuitry subsection 160 including for example receiver circuitry 162A-H. Sampling receiver circuitry 162A-H may process the sampled signal into baseband signal 165 (representative of a decoded version of baseband signal 102) to enable one or more baseband measurements by baseband measurements circuitry 168. Moreover, receiver circuitry components 162A-H may, in some example embodiments, include one or more of the following: a variable gain attenuator 162A, a down converter 162B including an oscillator 162E, an I and Q (in phase and quadrature phase) calibration block 162C, an I and Q level detector 162D, a variable attenuator 162F, a low pass filter 162G (for example, a variable low pass filter), an analog-to-digital converter 162H, and/or other circuitry components in other configurations as well. Sampling receiver circuitry may be dedicated to the measurements and/or shared (for example, a receiver of a radio which is used from time to time to make the measurements disclosed herein).

In some example embodiments, baseband measurement circuitry 168 may perform one or more measurements on baseband signal 165. The baseband measurements may be used to adjust the operation of the transmit driver 106 and/or power amplifier 108. Moreover, the adjustments may be performed repeatedly by sampling the output and repeatedly adjusting the operating point of the transmit driver 106 and/or power amplifier 108. In this sense, the power amplifier operating point (which defines the efficiency, amount of amplification, and thus signal quality) may be adapted during operation of transmitter 100.

To illustrate further, baseband measurement circuitry 168 may indicate that a baseband measurement, such as phase error, error vector magnitude (EVM), direct current (DC) offset, ACLR (adjacent channel leakage ratio), and/or other measurements of the baseband signal (or a channel in the baseband signal) may indicate an adjustment that can be made to the operating point of the RF subsection circuitry 104, transmit driver 106 and/or power amplifier 108. Moreover, this adjustment may also take into account power savings at the transmitter 100 in order to for example save power. For example, a measurement value may indicate that the amount of amplification provided by the power amplifier 108 may be changed but still maintain an acceptable level of quality with respect to for example measured phase error, EVM, and the like, while conserving used power. The measurements performed by baseband measurement circuitry may be feedback 170 as actual measurement values or as the actual adjustments to the operating point of RF-system circuitry 104, the transmit driver 106, and/or power amplifier 108 (for example, a change in a power amplifier supply voltage, a bias current that determines the operating point/amplification/efficiency of amplifier 108, and the like). In some example embodiments, baseband measurement value(s) may be compared to a distribution or threshold(s) representative of acceptable value(s) in terms of for example error or quality. For example, if the phase error, DC-offset, ACLR, and/or EVM are outside an acceptable range, an adjustment may be performed to the RF-system circuitry 104, transmit driver 106, and/or power amplifier 108. In some example embodiments, baseband measurement value(s) may be compared to a distribution that maps the measured value to an action, such as no action, a change in a bias current, and the like, and this action may be feedback at 170 to adjust the operating point of the RF-system circuitry 104, transmit driver 106, and/or power amplifier 108. The measurement source may be selected via directional coupler 110. Although FIG. 1 depicts selection from a single RF chain, the direction coupler 110 may be implemented as a device that samples from a plurality of sources, such as a plurality of RF chains associated with multiple receivers (for example, multiple input, multiple output (MIMO) transmitters and/or the like), where multiple transmitter signal optimization controls may be implemented via baseband measurement circuitry 108. The measurements may occur in parallel or may be sampled.

Figure 2:
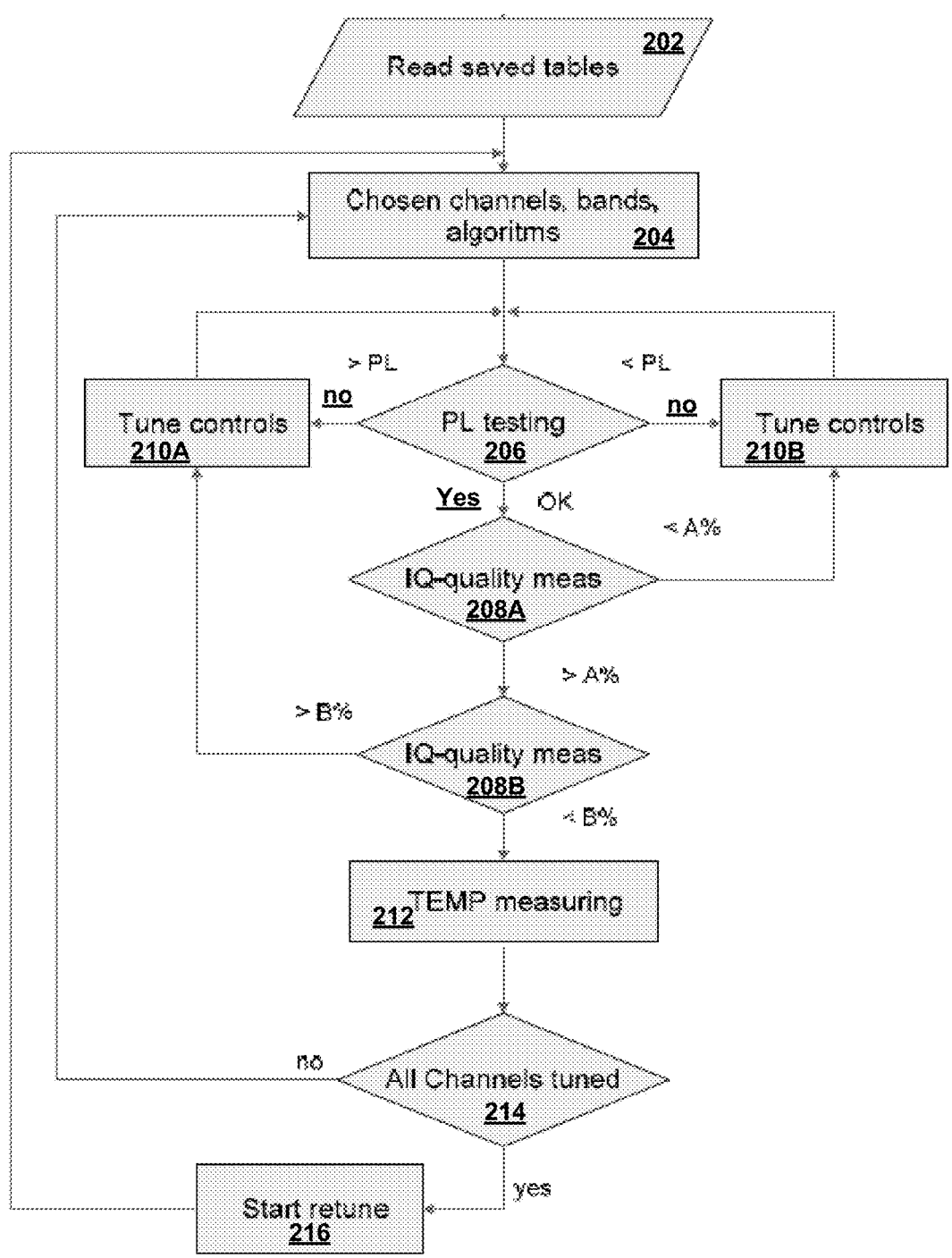
FIG. 2 depict an example of a process for power amplifier adaptation, in accordance with some exemplary embodiments.

FIG. 2 depicts an example process 200 for adjusting the quality and/or efficiency of a power amplifier, in accordance with some example embodiments. The description of process 200 also refers to FIG. 1.

At 202, values for the RF system circuitry 104, transmitter driver 106 and/or power amplifier 108 may be initially read from a look-up table, in accordance with some example embodiments. For example, the configuration (or operating point) of RF system circuitry 104, the transmitter driver 106, and/or power amplifier 108 may be initially defined in a look-up table that lists for example a bias current defining the operating point of the power amplifier 108. Look-up tables may be multi-dimensional, so each preset step in temperature may have its own look-up table. Those may include different tunable values and/or as DC offset, ACLR, different biases for measured current of the power amplifier, and/or direction coupler forward and reverse measured values. The direction coupler may also include forward and reverse signal levels and both measured levels can use optimization process 200. Transmitter load VSWR may also be read from the table and tuned via process 200.

At 204, a transmit channel or band may be selected for processing, in accordance with some example embodiments. For example, the transmitter 100 (or processor circuitry therein) may select a channel of the modulated carrier signal for processing.

At 206, a power level at the output of power amplifier 108 may be determined, in accordance with some example embodiments. For example, a measurement of the power amplifier 108 output may be performed to determine the signal strength or power of the power amplifier 108 output.

If the power level is not within an acceptable range (no at 206), tuning of one or more parameters of the transmitter driver 106 and/or power amplifier 108 may be performed at 210A-B. For example, if the power level is less than a first threshold (for example, "<PL"), feedback may be provided to tune, at 210B, the amount of amplification provided by power amplifier 108 in order to increase the output power. If the power level is however less than a second threshold (for example, ">PL"), feedback may be provided at 210A to adjust the amount of amplification provided by power amplifier 108 to decrease the output power. In 210A-B, the other parameters, such as DC offset of transmitter at 104, modulator filterer bandwidth at filer 104, and/or other parameters, may be tuned as well. Signal quality calculation for one or more dimensions with respect to the parameters may take into account blocks 308 and 310 as described with respect to FIG. 3 below.

If the power level is within an acceptable range (yes at 206), one or more measurements may be performed at 208A and 208B, in accordance with some example embodiments. In some example embodiments, one or more measurements may be performed on the baseband signal 165. For example, the baseband measurement circuitry may determine a phase error, an error vector magnitude, and/or any other baseband measurements in order to assess the quality of baseband signal 165 (or a portion or channel within the baseband signal). Although process 200 depicts 2 baseband measurements being performed at 208A and 208B, other quantities or measurements and types of measurements may be performed as well.

At 208A, a phase error may be measured for baseband signal, and, if the measured phase error is less than a certain threshold value (for example, "<A %"), tuning may be performed at 210B. However, if the phase error is more than the certain threshold value (for example, ">A %"), another baseband measurement may be performed at 210. Moreover, an error vector magnitude may measure for baseband signal 165, and, if the measured error vector magnitude is determined at 208B to be greater than a certain threshold value (for example, ">B %"), tuning may be performed at 210A. However, if the measured error vector magnitude is less than the certain threshold value (for example, "<B %"), then the process may proceed. For example, the process may proceed to example temperature and other determinations/measurements, such as SWR, and these other determinations/measurements may be taken into account, at 212, and the results used to further tune one or more parameters of the RF circuitry 104, transmitter driver 106 and/or power amplifier 108.

In some example embodiments, one or more aspects of process 200 may be repeated at 214 until all of the channels of the power amplifier 108 have been processed in order to determine an optimum quality and/or efficiency setting for the transmitter driver 106 and/or power amplifier 108.

At 216, the tuning may be performed one or more times in order to provide adjusting the power amplifier 108 output over time, in accordance with some example embodiments. For example, as the baseband signal changes over time, process 200 may adjust the operating point of the transmit driver 106 and/or power amplifier 108 while taking into account amplifier efficiency, baseband signal quality, and/or power savings.

Figure 3:
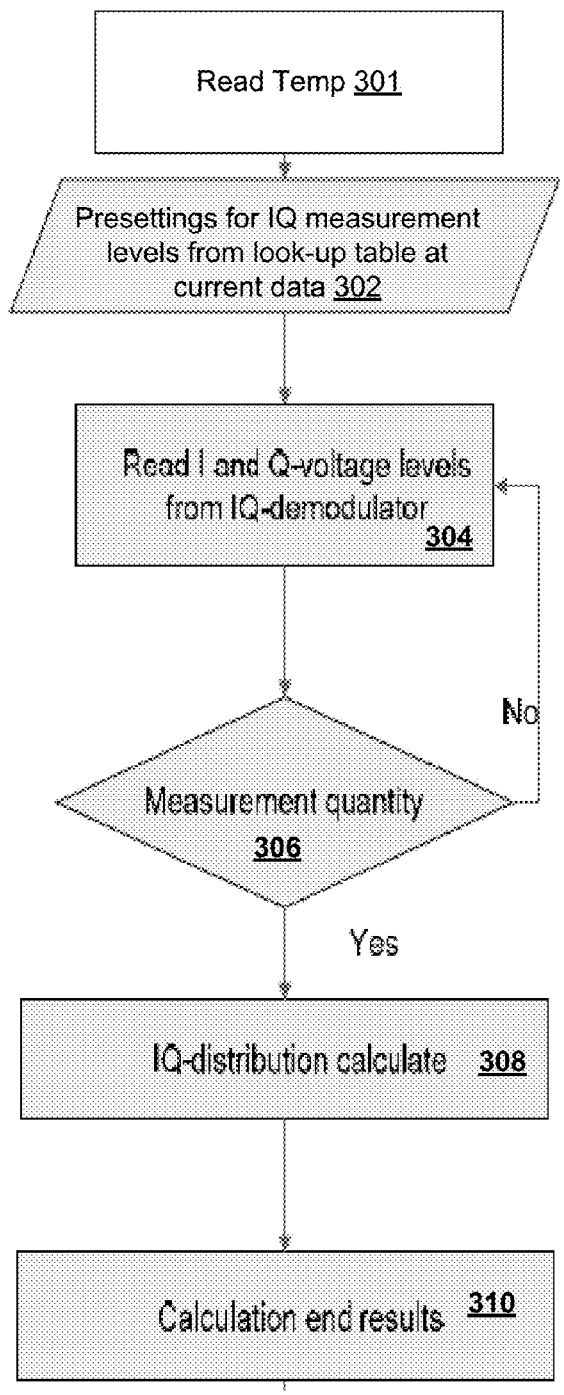
FIG. 3 depict an example of a process for making measurements for power amplifier adaptation, in accordance with some exemplary embodiments.

FIG. 3 depicts an example process 300 for the baseband measurements performed at for example 208 and/or 210 a FIG. 2, in accordance with some example embodiments. The description of process 300 also refers to FIGS. 1 and 2.

At 301, a temperature value may be measured or otherwise determined, in accordance with some example embodiments. For example, the measured temperature may have corresponding look-up tables to be used in process 200.

At 302, reference or historical values for the baseband measurement levels, such as I and Q measurements, may be obtained for the corresponding temperature determined at 301, in accordance with some example embodiments. For example, the values "A" and "B" at FIG. 2 (depicting minimum and maximum acceptable phase error or EVM values) may be obtained or read from a look-up table for a given temperature at 302.

At 304, baseband measurements, such as I and Q measurements, may the received (or read) from for example baseband measurement circuitry 168, in accordance with some example embodiments. These measurements may represent actual measurements, rather than the look-up values obtained at 302.

At 306, a measurement quantity is determined, in accordance with some example embodiments. For example, phase error or EVM may be determined based on the I and Q measurements obtained at 304, although other parameters may be determined as well.

At 308, an I and Q distribution may be calculated, in accordance with some example embodiments. If phase error is the measurement quantity at 306, a phase error distribution may be calculated indicating acceptable phase error values. If EVM is the measurement quantity at 306, an EVM distribution may be calculated indicating acceptable I and Q values. The distribution may also be pre-generated and/or pre-stored as well (for example, to the look-up table noted above). For example, the objective may be to decrease current consumption until transmit quality is sufficient for a given system specification (for example, EVM may be adjusted to reach a given power savings).

At 310, the measurements determined at 306 may be compared (or mapped to) the distribution generated at 308 to determine an action, such as whether an adjustment should be made, in accordance with some example embodiments. For example, an I/Q measurement calculation may generate a change to DC offset, bias, and/or other parameters at RF circuitry 104, transmit driver 106, and/or power amplifier 108. The process 300 may also generate this change based on one or more measurement samples taken at 306. ACLR may also be calculated at 310 based for measurement results from different states of I/Q demodulator at 304.

Figure 4A:
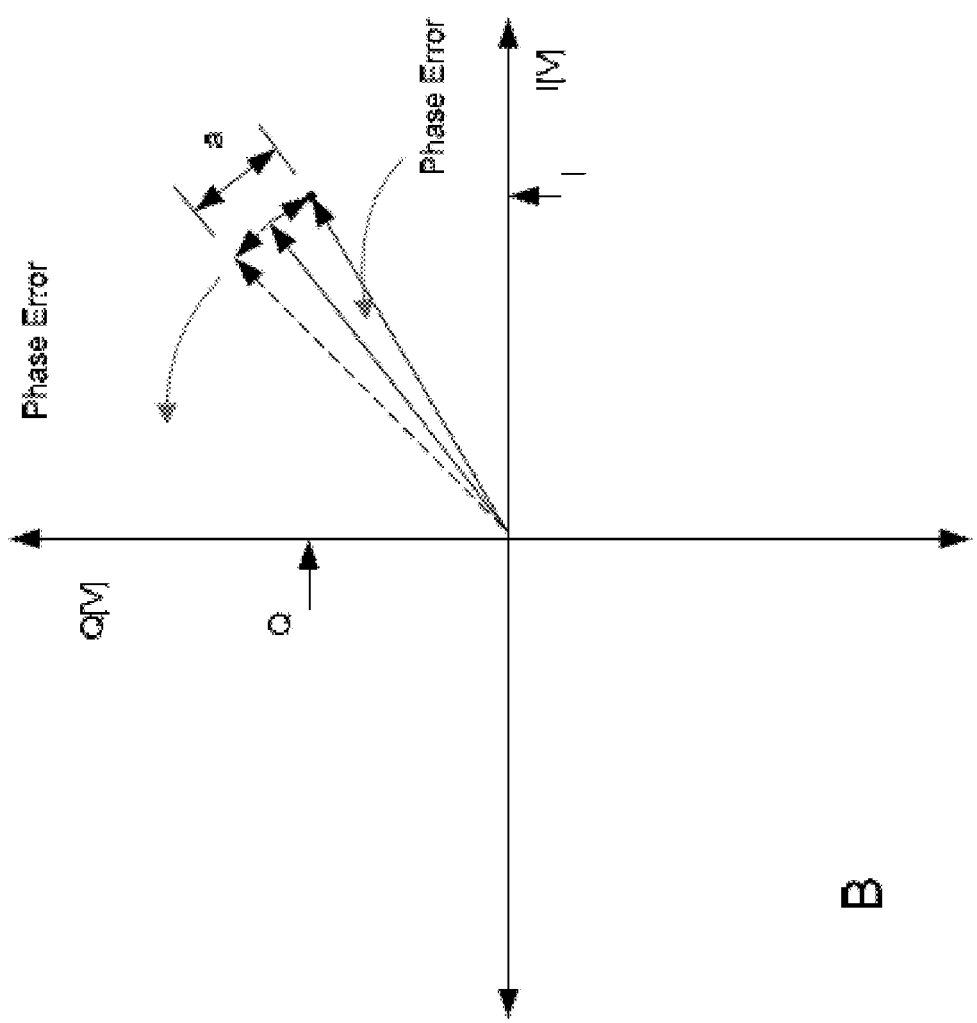
FIG. 4A depicts a plot of phase error, in accordance with some exemplary embodiments.

FIG. 4A depicts an example phase error plot generated based on measurements of the baseband signal 165, in accordance with some example embodiment. For example, the I and Q measurements obtained at 304 may be plotted as shown at FIG. 4A to determine phase error. To illustrate further, if the quality of baseband signal 165 is relatively poor, this may be reflected in the phase error which may be measured as shown in FIG. 4A. In FIG. 4A, the phase error may vary as a function of power amplifier transmission quality and/or amplification, amplifier bias values, and/or other factors.

FIG. 4B depicts an example of a distribution of phase errors (which may be generated at 308), in accordance with some example embodiments. If the measurement quality, which in this example is phase error, is within the range of A and B as shown, the phase error may not dictate tuning of the transmit driver and/or power amplifier. However, if the phase error measurement quality is outside the range of A and B as shown, the phase error may dictate tuning of the RF circuitry 104, transmit driver 106, and/or power amplifier 108, in accordance with some example embodiments. To illustrate further, if the phase error is "0," no adjustments may be dictated by the phase error, but a measurement of "2" may indicate too large a phase error, which means that distribution of phase error is too large, so the re-tuning at 210A-B may vary one or more parameters of RF system circuitry 104, transmit driver 106, and/or power amplifier 107 to meet a quality of signal requirement while satisfying power consumption requirements.

Figure 4C:
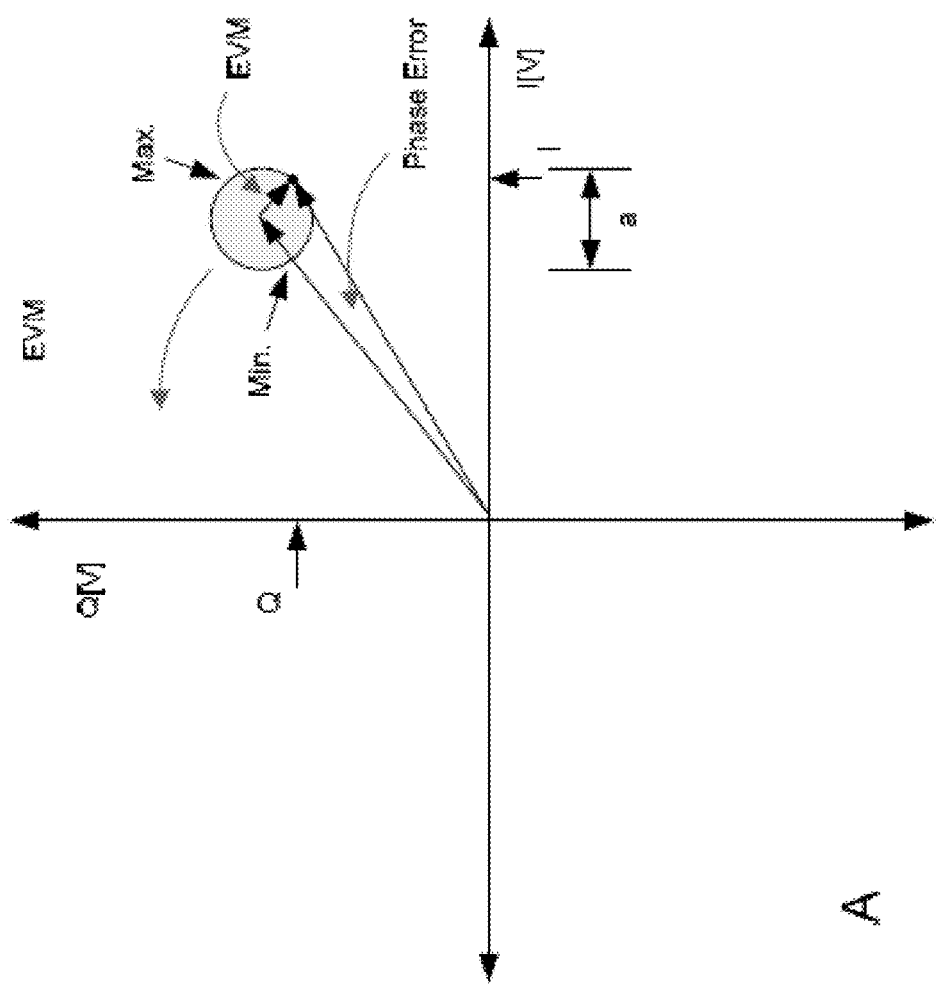
FIG. 4C depicts a plot of error vector magnitude (EVM), in accordance with some exemplary embodiments.
Figure 4D:
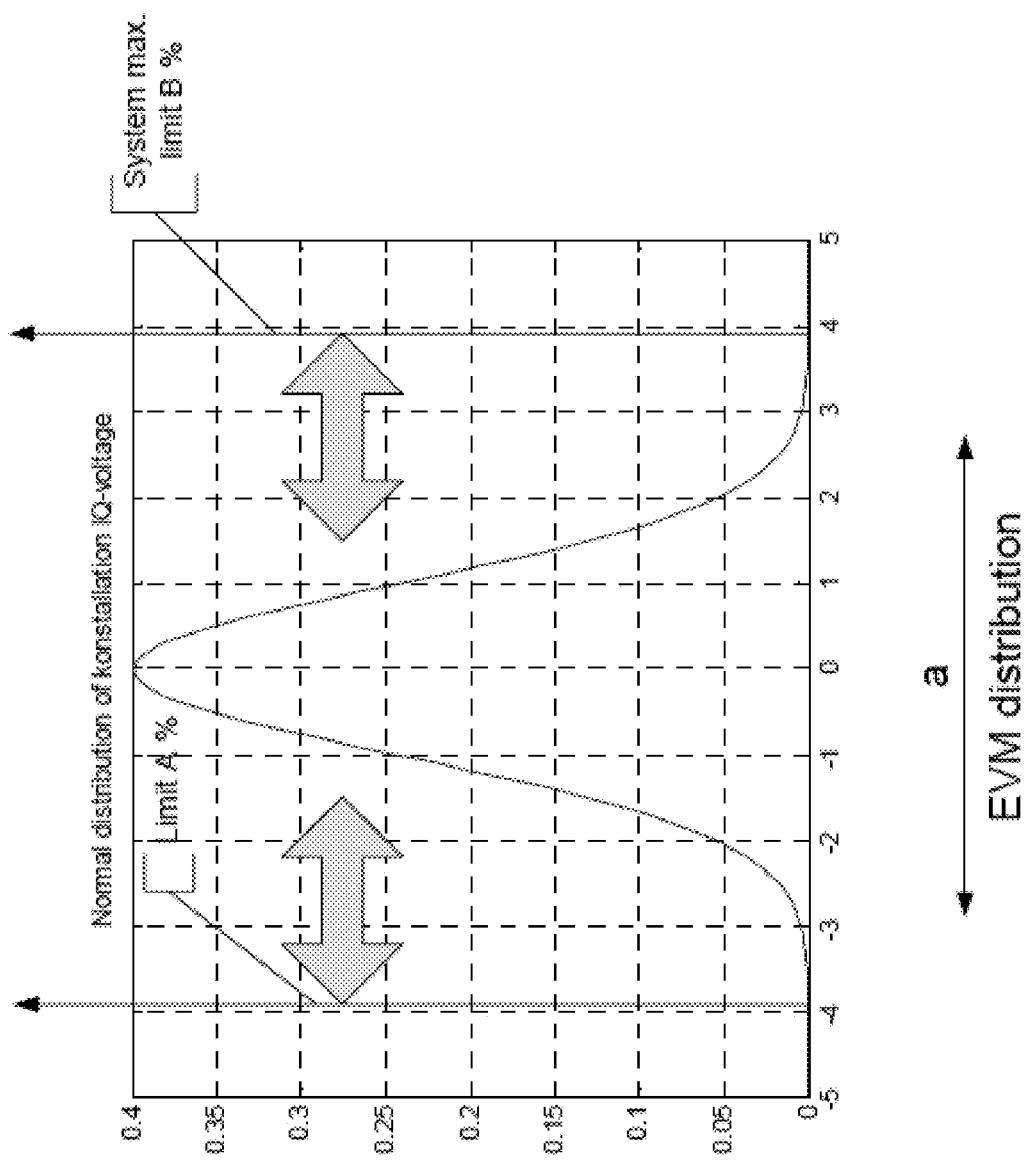
FIG. 4D depicts a plot of EVM distribution, in accordance with some exemplary embodiments.

FIG. 4C depicts an example an EVM plot generated based on measurements of the baseband signal 165, in accordance with some example embodiment. EVM takes into account phase and amplitude errors in the transmission signal. For example, I and Q measurements obtained at 304 may be plotted as shown at FIG. 4C to assess EVM. To illustrate further, if the quality of baseband signal 165 is relatively poor, EVM may be used to assess quality as shown in FIG. 4C. FIG. 4D depicts an example of a distribution of EVM (which may be generated at 308), in accordance with some example embodiments. If the measurement quality, which in this example is EVM, is within the range of A and B as shown, the EVM may not dictate tuning of the transmit driver and/or power amplifier. However, if the EVM measurement quality is outside the range of A and B as shown, the EVM may dictate tuning of the transmit driver and/or power amplifier, in accordance with some example embodiments.

Processes 200 and/or 300 may be thus be implemented to optimize quality of the baseband signal while also minimizing use of bias current and/or supply voltage to the power amplifier, in accordance with some example embodiments. Minimizing this current and/or voltage usage may also reduce the drain of a battery or other power source, when the transmitter is battery powered.

Figure 5A:
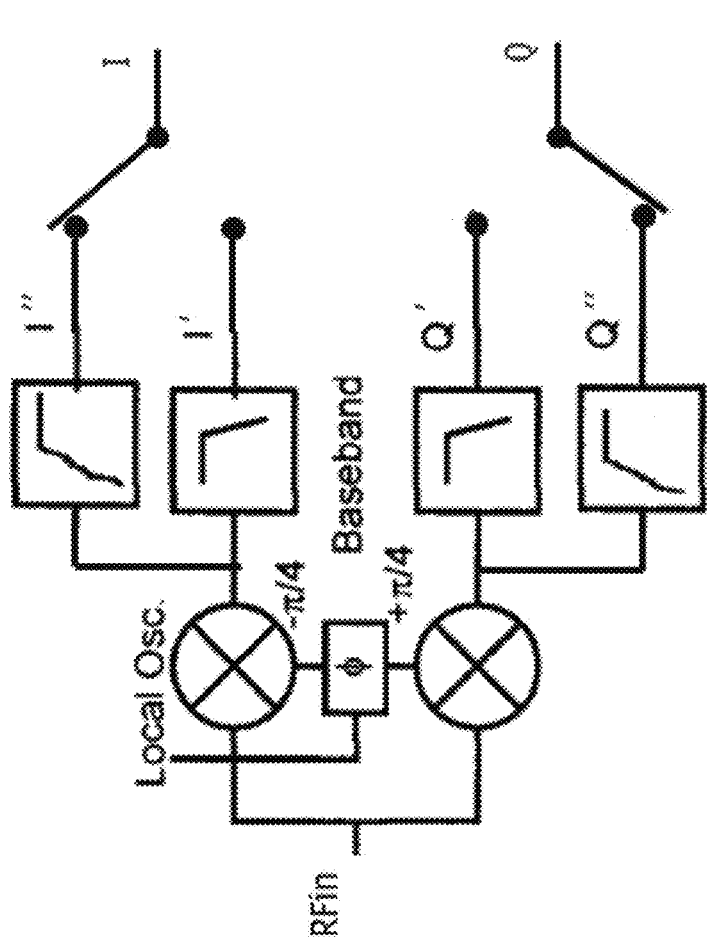
FIGS. 5A-5B depict examples of circuitry which may be used to perform adjacent channel measurement, in accordance with some exemplary embodiments.
Figure 5B:
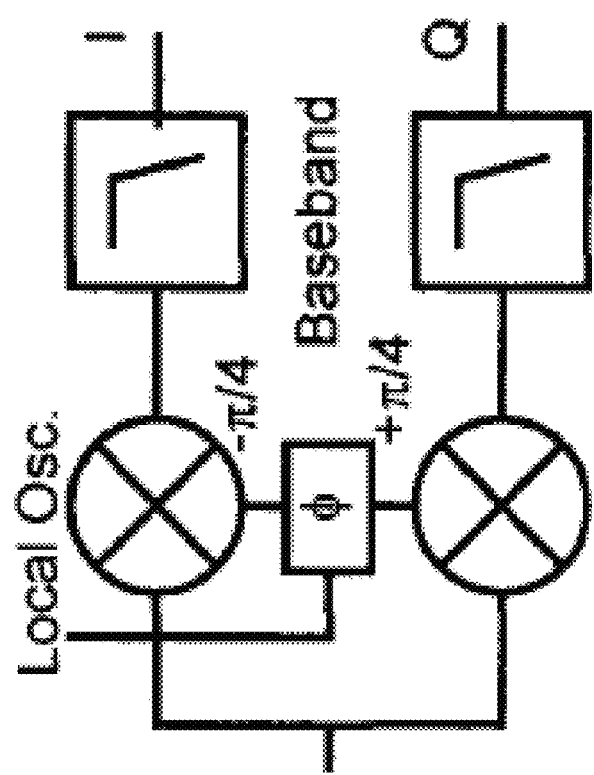

FIGS. 5A-B depicts circuitry which may be used to perform detect I and Q in adjacent channel measurement, in accordance with some example embodiments. The I/Q detector/demodulator may be used to select inside or outside channel signal measures. The local oscillator may be the same (or different) source as transmitter chain. The output may be used to select in channel or out of channel signal for measurements by switching as shown.

Figure 6:
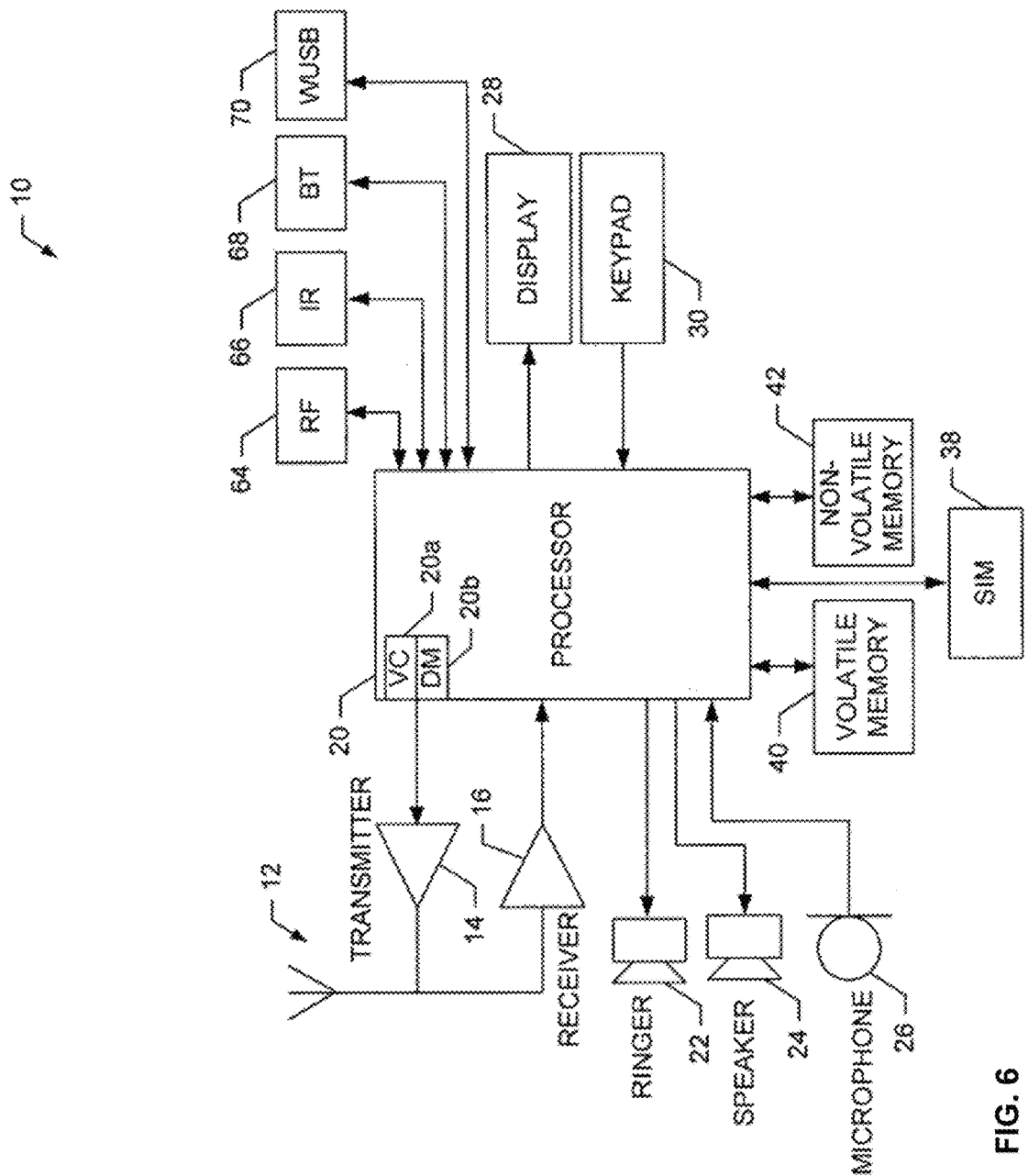
FIG. 6 depicts an example of user equipment, in accordance with some exemplary embodiments.

FIG. 6 illustrates a block diagram of an apparatus 10, in accordance with some example embodiments. The apparatus 10 (or portions thereof) may be configured to a user equipment, a machine type communication device, a wireless device, a wearable device, a smartphone, a cellular phone, a wireless sensor/device, a gaming device, and/or any other transceiver or processor-based device.

The apparatus 10 may include at least one antenna 12 in communication with a transmitter(s) 14 and a receiver 16. Alternatively transmit and receive antennas may be separate.

In some example embodiments, the transmitter(s) 14 may include one or more aspects of system 100. For example, the transmit driver, power amplifier 108, directional coupler 110, and sampling receiver circuitry subsection 160 (or one or more components therein).

The apparatus 10 may also include a processor 20 configured to provide signals to and receive signals from the transmitter and receiver, respectively, and to control the functioning of the apparatus. Processor 20 may be configured to control the functioning of the transmitter and receiver by effecting control signaling via electrical leads to the transmitter and receiver. Likewise, processor 20 may be configured to control other elements of apparatus 10 by effecting control signaling via electrical leads connecting processor 20 to the other elements, such as a display or a memory. The processor 20 may, for example, be embodied in a variety of ways including circuitry, at least one processing core, one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits (for example, an application specific integrated circuit (ASIC), a field programmable gate array (FPGA), and/or the like), or some combination thereof. Accordingly, although illustrated in FIG. 6 as a single processor, in some example embodiments the processor 20 may comprise a plurality of processors or processing cores.

Signals sent and received by the processor 20 may include signaling information in accordance with an air interface standard of an applicable cellular system, and/or any number of different wireline or wireless networking techniques, comprising but not limited to Wi-Fi, wireless local access network (WLAN) techniques, such as Institute of Electrical and Electronics Engineers (IEEE) 802.11, 802.16, and/or the like. In addition, these signals may include speech data, user generated data, user requested data, and/or the like.

The apparatus 10 may be capable of operating with one or more air interface standards, communication protocols, modulation types, access types, and/or the like. For example, the apparatus 10 and/or a cellular modem therein may be capable of operating in accordance with various first generation (1G) communication protocols, second generation (2G or 2.5G) communication protocols, third-generation (3G) communication protocols, fourth-generation (4G) communication protocols, Internet Protocol Multimedia Subsystem (IMS) communication protocols (for example, session initiation protocol (SIP) and/or the like. For example, the apparatus 10 may be capable of operating in accordance with 2G wireless communication protocols IS-136, Time Division Multiple Access TDMA, Global System for Mobile communications, GSM, IS-95, Code Division Multiple Access, CDMA, and/or the like. In addition, for example, the apparatus 10 may be capable of operating in accordance with 2.5G wireless communication protocols General Packet Radio Service (GPRS), Enhanced Data GSM Environment (EDGE), and/or the like. Further, for example, the apparatus 10 may be capable of operating in accordance with 3G wireless communication protocols, such as Universal Mobile Telecommunications System (UMTS), Code Division Multiple Access 2000 (CDMA2000), Wideband Code Division Multiple Access (WCDMA), Time Division-Synchronous Code Division Multiple Access (TD-SCDMA), and/or the like. The apparatus 10 may be additionally capable of operating in accordance with 3.9G wireless communication protocols, such as Long Term Evolution (LTE), Evolved Universal Terrestrial Radio Access Network (E-UTRAN), and/or the like (including Carrier Aggregation in MIMO. Additionally, for example, the apparatus 10 may be capable of operating in accordance with 4G wireless communication protocols, such as LTE Advanced and/or the like as well as similar wireless communication protocols that may be subsequently developed.

It is understood that the processor 20 may include circuitry for implementing audio/video and logic functions of apparatus 10. For example, the processor 20 may comprise a digital signal processor device, a microprocessor device, an analog-to-digital converter, a digital-to-analog converter, and/or the like. Control and signal processing functions of the apparatus 10 may be allocated between these devices according to their respective capabilities. The processor 20 may additionally comprise an internal voice coder (VC) 20*a*, an internal data modem (DM) 20*b*, and/or the like. Further, the processor 20 may include functionality to operate one or more software programs, which may be stored in memory. In general, processor 20 and stored software instructions may be configured to cause apparatus 10 to perform actions. For example, processor 20 may be capable of operating a connectivity program, such as a web browser. The connectivity program may allow the apparatus 10 to transmit and receive web content, such as location-based content, according to a protocol, such as wireless application protocol, WAP, hypertext transfer protocol, HTTP, and/or the like.

Apparatus 10 may also comprise a user interface including, for example, an earphone or speaker 24, a ringer 22, a microphone 26, a display 28, a user input interface, and/or the like, which may be operationally coupled to the processor 20. The display 28 may, as noted above, include a touch sensitive display, where a user may touch and/or gesture to make selections, enter values, and/or the like. The processor 20 may also include user interface circuitry configured to control at least some functions of one or more elements of the user interface, such as the speaker 24, the ringer 22, the microphone 26, the display 28, and/or the like. The processor 20 and/or user interface circuitry comprising the processor 20 may be configured to control one or more functions of one or more elements of the user interface through computer program instructions, for example, software and/or firmware, stored on a memory accessible to the processor 20, for example, volatile memory 40, non-volatile memory 42, and/or the like. The apparatus 10 may include a battery for powering various circuits related to the mobile terminal, for example, a circuit to provide mechanical vibration as a detectable output. The user input interface may comprise devices allowing the apparatus 20 to receive data, such as a keypad 30 (which can be a virtual keyboard presented on display 28 or an externally coupled keyboard) and/or other input devices.

As shown in FIG. 6, apparatus 10 may also include one or more mechanisms for sharing and/or obtaining data. For example, the apparatus 10 may include a short-range radio frequency (RF) transceiver and/or interrogator 64, so data may be shared with and/or obtained from electronic devices in accordance with RF techniques. The apparatus 10 may include other short-range transceivers, such as an infrared (IR) transceiver 66, a Bluetooth™ (BT) transceiver 68 operating using Bluetooth™ wireless technology, a wireless universal serial bus (USB) transceiver 70, a Bluetooth™ Low Energy transceiver, a ZigBee transceiver, an ANT transceiver, a cellular device-to-device transceiver, a wireless local area link transceiver, and/or any other short-range radio technology. Apparatus 10 and, in particular, the short-range transceiver may be capable of transmitting data to and/or receiving data from electronic devices within the proximity of the apparatus, such as within 10 meters, for example. The apparatus 10 including the Wi-Fi or wireless local area networking modem may also be capable of transmitting and/or receiving data from electronic devices according to various wireless networking techniques, including 6LoWpan, Wi-Fi, Wi-Fi low power, WLAN techniques such as IEEE 802.11 techniques, IEEE 802.15 techniques, IEEE 802.16 techniques, and/or the like.

The apparatus 10 may comprise memory, such as a subscriber identity module (SIM) 38, a removable user identity module (R-UIM), an eUICC, an UICC, and/or the like, which may store information elements related to a mobile subscriber. In addition to the SIM, the apparatus 10 may include other removable and/or fixed memory. The apparatus 10 may include volatile memory 40 and/or non-volatile memory 42. For example, volatile memory 40 may include Random Access Memory (RAM) including dynamic and/or static RAM, on-chip or off-chip cache memory, and/or the like. Non-volatile memory 42, which may be embedded and/or removable, may include, for example, read-only memory, flash memory, magnetic storage devices, for example, hard disks, floppy disk drives, magnetic tape, optical disc drives and/or media, non-volatile random access memory (NVRAM), and/or the like. Like volatile memory 40, non-volatile memory 42 may include a cache area for temporary storage of data. At least part of the volatile and/or non-volatile memory may be embedded in processor 20. The memories may store one or more software programs, instructions, pieces of information, data, and/or the like which may be used by the apparatus for performing operations, such as process processes 200, 300, and/or any other operations/functions disclosed herein (including, for example, sampling an output of a power amplifier, wherein the sampled power amplifier output represents a modulated carrier being transmitted; processing to baseband the sampled power amplifier output; and determining one or more adjustments to the power amplifier, wherein the determined one or more power adjustments are determined based on at least one or more measurements performed on the baseband). The memories may comprise an identifier, such as an international mobile equipment identification (IMEI) code, capable of uniquely identifying apparatus 10. The memories may comprise an identifier, such as an international mobile equipment identification (IMEI) code, capable of uniquely identifying apparatus 10. In the example embodiment, the processor 20 may be configured using computer code stored at memory 40 and/or 42 to control and/or provide one or more aspects disclosed herein with respect to processes 200, 300 and the like including for example sampling an output of a power amplifier; processing to baseband the sampled power amplifier output; and determining one or more adjustments to the power amplifier, wherein the determined one or more power adjustments are determined based on at least one or more measurements performed on the baseband.

Some of the embodiments disclosed herein may be implemented in software, hardware, application logic, or a combination of software, hardware, and application logic. The software, application logic, and/or hardware may reside on memory 40, the control apparatus 20, or electronic components, for example. In some example embodiment, the application logic, software or an instruction set is maintained on any one of various conventional computer-readable media. In the context of this document, a "computer-readable medium" may be any non-transitory media that can contain, store, communicate, propagate or transport the instructions for use by or in connection with an instruction execution system, apparatus, or device, such as a computer or data processor circuitry, with examples depicted at FIG. 6, computer-readable medium may comprise a non-transitory computer-readable storage medium that may be any media that can contain or store the instructions for use by or in connection with an instruction execution system, apparatus, or device, such as a computer.

Without in any way limiting the scope, interpretation, or application of the claims appearing below, a technical effect of one or more of the example embodiments disclosed herein is more efficient use of power amplifiers and/or power savings at a user equipment.

The subject matter described herein may be embodied in systems, apparatus, methods, and/or articles depending on the desired configuration. For example, the base stations and user equipment (or one or more components therein) and/or the processes described herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "computer-readable medium" refers to any computer program product, machine-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. Other embodiments may be within the scope of the following claims.

If desired, the different functions discussed herein may be performed in a different order and/or concurrently with each other. Furthermore, if desired, one or more of the above-described functions may be optional or may be combined. Although various aspects of some of the embodiments are set out in the independent claims, other aspects of some of the embodiments comprise other combinations of features from the described embodiments and/or the dependent claims with the features of the independent claims, and not solely the combinations explicitly set out in the claims. It is also noted herein that while the above describes example embodiments, these descriptions should not be viewed in a limiting sense. Rather, there are several variations and modifications that may be made without departing from the scope of some of the embodiments as defined in the appended claims. Other embodiments may be within the scope of the following claims. The term "based on" includes "based on at least." The use of the phase "such as" means "such as for example" unless otherwise indicated.

What is claimed:

1. A method comprising:
    sampling an output of a power amplifier, wherein the sampled power amplifier output represents a modulated carrier being transmitted;
    processing, by at least downconverting and performing an in-phase and quadrature phase detection, the sampled power amplifier output to a baseband of the sampled power amplifier output;
    performing on the in-phase and quadrature phase of the baseband of the sampled power amplifier output at least one measurement indicative of a quality only of the baseband of the sampled power amplifier output, wherein the at least one measurement comprises a phase error of the in-phase and quadrature phase of the baseband;
    determining, based on at least the at least one measurement comprising the phase error performed on the baseband and a power consumption of the power amplifier, one or more adjustments of a voltage to the power amplifier and/or a bias current to the power amplifier; and
    adapting, based on the determined one or more adjustments, an operating point of the power amplifier by at least adjusting the voltage and/or the bias current, wherein a sampling receiver circuitry is dedicated to at least the processing and the performing, the sampling receiver circuitry separate from a transceiver used to transmit and/or receive to other devices.

2. The method of claim 1, wherein the sampling includes sampling each of a plurality of transmit chains to determine one or more adjustments to a corresponding power amplifier at each of the plurality of transmit chains.

3. The method of claim 2, wherein the plurality of transmit chains includes multiple input, multiple output transmitters.

4. The method of claim 1, wherein the determining further comprises:
    measuring in-phase and quadrature phase values output by a decoder, wherein the phase error comprises a determination of an error vector magnitude.

5. The method of claim 4 further comprising:
    calculating at least one parameter representative of the quality of the baseband.

6. The method of claim 5 further comprising:
    comparing the at least one parameter representative of the quality of the baseband to one or more reference values to determine the one or more adjustments to the power amplifier.

7. The method of claim 6, wherein the one or more reference values take into account a temperature.

8. The method of claim 6, wherein the quality represents an adjacent channel measurement.

9. The method of claim 1, wherein the determined one or more adjustments to the power amplifier include an adjustment to at least one of the power amplifier, a transmit driver, and/or a radio frequency circuitry, wherein the one or more adjustments are determined based on a distribution of phase error measurements performed on the baseband.

10. The method of claim 1, wherein the determining of the one or more adjustments further includes determining, based on a temperature, one or more adjustments.

11. The method of claim 1, wherein the one or more adjustments move an operating point of the power amplifier while taking into account the power consumption of the power amplifier.

12. The method of claim 1, wherein the one or more adjustments move an operating point to maintain the quality within a predetermined range while minimizing the power consumption of the power amplifier.

13. An apparatus comprising:
    a coupler configured to sample an output of a power amplifier, wherein the sampled power amplifier output represents a modulated carrier being transmitted; and
    a receiver configured to at least:
        process, by at least downconverting and performing an in-phase and quadrature phase detection, the sampled power amplifier output to a baseband of the sampled power amplifier output,
        perform, on the in-phase and quadrature phase of the baseband of the sampled power amplifier output, at least one measurement indicative of a quality only of the baseband of the sampled power amplifier output, wherein the at least one measurement comprises a phase error of the in-phase and quadrature phase of the baseband, determine, based on at least the at least one measurement performed on the baseband and a power consumption of the power amplifier, one or more adjustments of a voltage to the power amplifier and/or a bias current to the power amplifier, and adapt, based on the determined one or more adjustments, an operating point of the power amplifier by at least adjusting the voltage and/or the bias current, wherein the receiver comprises a sampling receiver circuitry dedicated to at least process the sampled amplifier output and perform the at least one measurement, the sampling receiver circuitry separate from a transceiver used to transmit and/or receive to other devices.

14. The apparatus of claim 13, wherein the sampling includes sampling each of a plurality of transmit chains is sampled to at least determine one or more adjustments to a corresponding power amplifier at each of the plurality of transmit chains, and wherein the at least one measurement indicative of quality further comprises an error vector magnitude of the baseband of the sampled power amplifier output.

15. The apparatus of claim 14, wherein the plurality of transmit chains includes multiple input, multiple output transmitters.

16. The apparatus of claim 13, wherein the receiver is further configured to at least measure in-phase and quadrature phase values output by a decoder, wherein the phase error comprises a determination of an error vector magnitude.

17. The apparatus of claim 16, wherein the receiver is further configured to at least calculate at least one parameter representative of the quality of the baseband.

18. The apparatus of claim 17, wherein the receiver is further configured to at least compare the at least one parameter representative of the quality of the baseband to one or more reference values to determine the one or more adjustments to the power amplifier.

19. The apparatus of claim 18, wherein the one or more reference values take into account a temperature.

20. The apparatus of claim 18, wherein the quality represents an adjacent channel measurement.

21. The apparatus of claim 13, wherein the determined one or more adjustments to the power amplifier include an adjustment to at least one of the power amplifier, a transmit driver, and/or a radio frequency circuitry, wherein the one or more adjustments are determined based on a distribution of phase error measurements performed on the baseband.

* * * * *